United States Patent [19]

Wiech, Jr.

[11] Patent Number: 4,531,145

[45] Date of Patent: Jul. 23, 1985

[54] METHOD OF FABRICATING COMPLEX MICRO-CIRCUIT BOARDS AND SUBSTRATES AND SUBSTRATE

[75] Inventor: Raymond E. Wiech, Jr., San Diego, Calif.

[73] Assignee: Fine Particle Technology Corporation, Camarillo, Calif.

[21] Appl. No.: 419,172

[22] Filed: Sep. 17, 1982

Related U.S. Application Data

[62] Division of Ser. No. 174,929, Aug. 4, 1980.

[51] Int. Cl.³ .................. H01L 23/34; H01L 23/12; H01L 23/48
[52] U.S. Cl. ........................... 357/81; 357/80; 357/82; 357/68
[58] Field of Search ............ 357/80, 81, 82, 68, 357/75, 65

[56] References Cited

U.S. PATENT DOCUMENTS 3,438,127 4/1969 Lehtonen .................. 174/68.5
4,056,681 11/1977 Cook, Jr. .................. 357/80 X

FOREIGN PATENT DOCUMENTS 0008976 1/1979 Japan ........................ 357/80
2046514 11/1980 United Kingdom .......... 357/68

Primary Examiner—Andrew J. James
Assistant Examiner—Sheila V. Clark
Attorney, Agent, or Firm—Jay M. Cantor

[57] ABSTRACT

A substrate and method of manufacture wherein a substrate is molded from particulate material wherein grooves on and through the body are formed during substrate molding and prior to sintering. The substrate includes all buss structure molded therein. Cooling of chips is provided by providing a heat sink in grooves formed within a substrate and beneath the chips.

4 Claims, 3 Drawing Figures

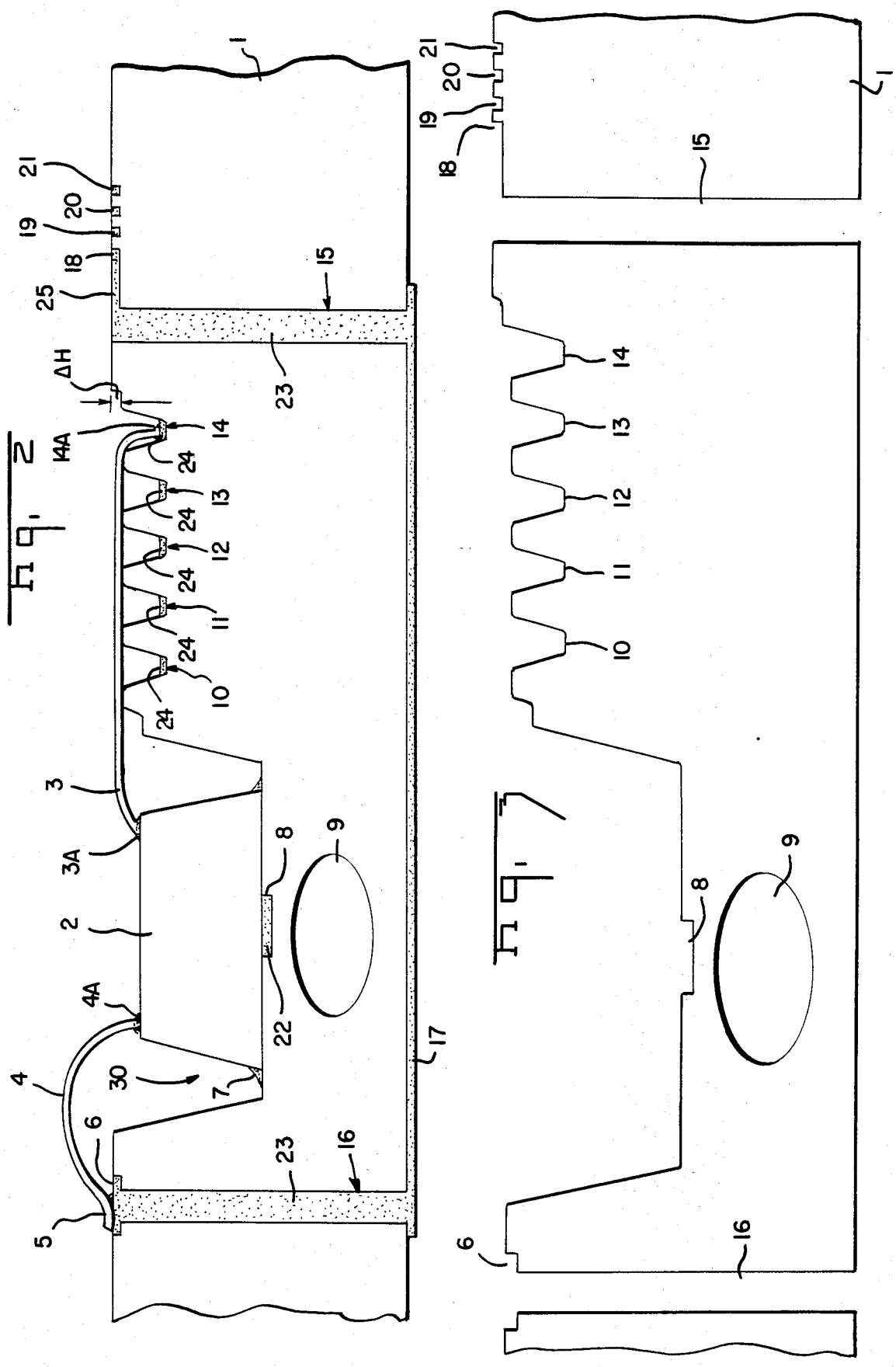

METHOD OF FABRICATING COMPLEX MICRO-CIRCUIT BOARDS AND SUBSTRATES AND SUBSTRATE

This is a division of Ser. No. 174,929 filed Aug. 4, 1980.

BACKGROUND OF THE INVENTION

1. Field of the Invention

This invention relates to the fabrication of complex microcircuit boards and substrates.

2. Description of the Prior Art

The art of forming shaped articles from particulate mixtures is well known. Classically a desired particulate material is mixed with a binder and then formed into the desired shape called a green body. The green body is then fired to provide a fusion of the particulate material and drive off the binder, thereby producing the desired shape product with proper surface texture, strength, etc.

In the production of micro-electronic substrates in the manner above described, it has been a practice to mix the particulate material, usually ceramic, and a thermoplastic binder system together and cast the mixed system onto a moving belt. The cast mixture is then adjusted to a given thickness by the use of a scraper or doctor blade. The green ceramic material, thus doctor bladed to a given desired thickness, is usually permitted to evaporate out a portion of the thermoplastic binder and the green dried sheet is then cut into desired lengths for further processing.

The green ceramic sheets thus formed have had a considerable amount of effort and cost expended in maintaining them to a specific thickness and every effort is also expended to maintain the sheets throughout their processing in a configuration in which the surfaces are as flat and parallel as possible. In subsequent manufacturing steps, alterations are made to this thin, flat, parallel-faced geometry by such techniques as punching holes through the green ceramic, laser scribing the green ceramic to cause depressions therein, the passage of the green ceramic beneath a saw or grinding wheel to scribe or machine a configuration into its surface and other techniques that are very well and thoroughly described in the literature of this art.

Subsequently, additional coatings are applied to the ceramic by one of several well known techniques, such as silk screen printing on to the flat surfaces of the ceramic substrate. In any case, the accepted practice starts with a ceramic substrate which is manufactured in a controlled flat configuration and is subsequently worked by a machining or other mechanical manufacturing process to alter the surface configuration to something other than a flat surface. As the green ceramic is quite delicate, the degree to which the flat, as formed, surface can be mechanically altered into a complex three dimensional configuration is severely limited and the ability to closely control the geometry of the holes is also severely limited.

In a complex hybrid substrate in which a great many components, both active and passive, are located on the substrate and interconnected to each other and to the outside world, the interconnection problem is extremely severe. Many components that are affixed to the substrate, such as micro-electronic circuits and transistors, are interconnected with the conductive paths formed on the substrate by means of fine wires which are welded to sensitive areas, termed pads, on the transistors or micro electronic circuits and terminated on the substrate by another weldment to a conductive area on the surface of the substrate. The wires that are utilized for these complex interconnections are extremely fine on the order of magnitude of 0.001 inches in diameter. Frequently, due to the interconnection requirements of the particular hybrid circuit, a wire must pass over another conductive path, usually, though not necessarily limited to, a metallized region on the substrate. When this is necessary, what is usually done is to provide, through multiple silk screening and firing techniques, an insulating layer that separates the two conductive paths so that a short circuit will not occur at the region of cross over.

Another problem prevalent in conventional substrate manufacture is that when the prepared substrate is fired, the shrinkage due to sintering is not uniform and not totally predictable. When the non-uniformity of the shrinkage of the substrate exceeds the tolerance limits of the subsequent silk screen printing operations on the surface of the substrate, it becomes impossible to register the printing on the substrate with any through holes that may exist on the substrate. This effect places a limitation on the size of the circuit being fabricated as any arbitrarily small size must be within the limits of these two independent manufacturing steps.

Another limitation found in conventional high density microcircuit boards and substrates is the dissipation of the heat generated in the high density packaged components in that the heat generated by placing components increasingly closer together becomes progressively more difficult to dissipate and remove from the surface as the circuit density increases. The conventional solution to this problem is to employ a substrate material that has the highest possible thermal conductivity. This is generally beryllium oxide which is generally considered to be highly toxic.

BRIEF DESCRIPTION OF THE INVENTION

The size reduction, heat dissipation and complex interconnection problems are substantially reduced or overcome in accordance with the present invention. Briefly, the green body from which the substrate will be fabricated is made by mixing together into a homogeneous mass ceramic particulate material and a thermoplastic binder. The ceramic-binder mixture is caused to flow into a mold or die cavity under heat and pressure. The die cavity contains all of the desired configuration including three dimensional configuration of the surface, all through holes, and any side holes, the axes of which are substantially parallel to the surface of the substrate. The molded substrate may then be introduced into another mold cavity and have subsequent shots of material, not necessarily of the same composition, mated to it in the green state. It may be desirable to mechanically work the molded green substrate between molding operations by adding or substracting material therefrom. After the desired green molded configuration has been built up, the molded substrate then has the thermoplastic material removed and is sintered to its final dense configuration in accordance with prior techniques as set forth in Strivens U.S. Pat. No. 2,939,199 and Weich U.S. Pat. No. 4,197,118.

After sintering, it may be desirable to apply electrically conductive material to the bottom of certain grooves molded into the substrate and/or fill other grooves that have been molded into the substrate with electrically conductive or other appropriate material. In general, those grooves, which have electrically conductive material applied only to the bottoms of the grooves will be part of buss structures and will have highly configured grooves that have been formed to accept various standard bonding tools. Other grooves that are intended primarily to be used as conductive paths will be much smaller and shallower, though a considerable third dimension will be apparent in these grooves. These conductor grooves are placed on the uppermost plane of the substrate or the lowermost plane of the substrate or both. The buss structure grooves will consist of a series of parallel grooves with essentially a corrugated like appearance. A wire bonded to the conductive material in the bottom of one of these buss structure corrugated grooves that is brought across the buss structure to a termination point can not short circuit to the conductive material at the bottom of adjacent or other grooves over which the conductor passes due to the geometry that has been molded into the surface. The result is that it is not necessary for the provision of special non-conducting areas to separate conductors that are crossing each other in this configuration. The conductors that have been placed in the groove in the uppermost surface of the substrate can be fabricated as fine as technology permits and, since they are an integral portion of the surface configuration of the substrate, they will always run between two arbitrary points on the substrate, irrespective of the possible non-uniformity in shrinkage, as they are molded as a portion of the substrate and not subsequently printed onto the substrate.

Raised conductors are fabricated by molding raised structures and metallizing the uppermost portions of these structures. Raised structures can be terminated in geometrical configurations that match the pad areas on the chips so that the chips can be bonded directly to the substrate by the practices employed in "flip-chip" bonding techniques.

Holes with axes that are molded parallel to the surface of the substrate can be employed as coolant passages so that active or passive cooling can be readily accomplished, thereby minimizing the heat dissipation problem.

In addition, semiconductor chips can be sandwiched between a pair of substrates with conducting paths on facing sides of an adjacent pair of substrates contacting conductive pads on one or more semiconductor chips mounted between the substrates. Cooling can take place by means of a heat sink material disposed in holes in the substrates above and/or below the chips. Freon for example, could be passed through the holes as a heat sink. In this way, heat can be removed from above and/or below the chip and conductive paths can also contact pads on chips simultaneously from two different substrates. Bumps as noted above can also be placed on one or more substrates. A cooling medium can also be passed between adjacent substrates, the medium merely requiring the properties of being a heat sink and being electrically non-conductive.

BRIEF DESCRIPTION OF THE DRAWINGS

FIG. 2 is a view taken along the line 2—2 of FIG. 1; and

FIG. 3 is a view as in FIG. 1 but prior to firing.

DESCRIPTION OF THE PREFERRED EMBODIMENTS

Figure 1:
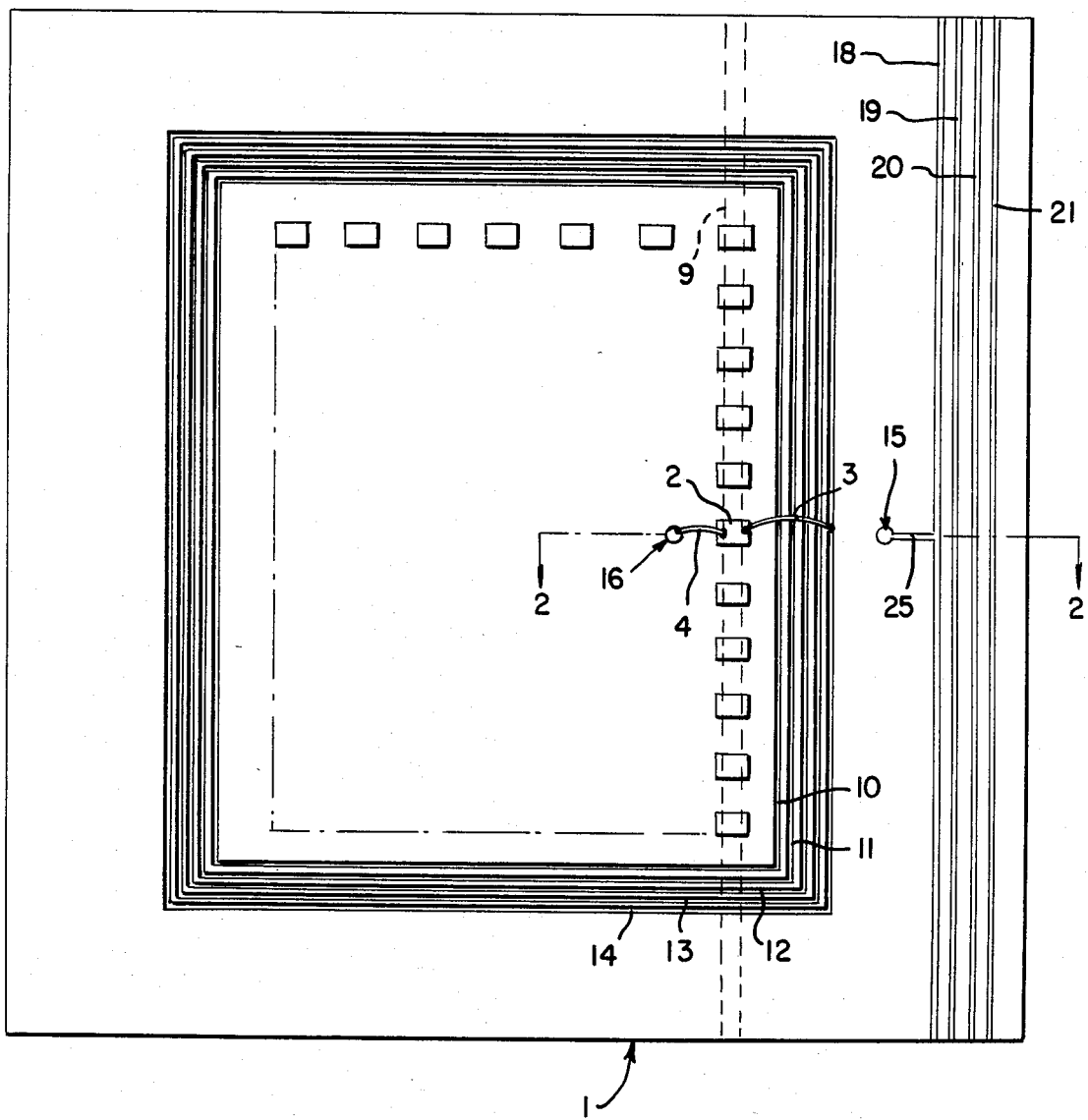
FIG. 1 is a top view of a preferred embodiment of the present invention.

At the outset, it should be understood that while the discussion of the specific embodiments of the invention will be provided mainly with reference to ceramics, the invention also applies to metals, plastics, and any other materials that can be made to be moldable. In the manufacture of complex micro-circuit boards and substrates, it has been necessary in the prior art that these parts undergo precision machining and/or printing operations in order to provide the final article with the desired characteristics. In accordance with the prior art, the formability limitations and the requirements for independent tolerancing limited yields and complexity of the desired final articles. In accordance with the present invention, ceramic materials can now be molded directly from particulate material to provide the precision finished product without the necessity of machining and substantially reducing other costly processing steps.

FIGS. 1 and 2 present a preferred embodiment of the invention. With reference to FIGS. 1 and 2 there is shown a portion of a substrate 1, preferably of aluminum oxide. Element 2 is a microelectronic device, commonly referred to as a die or chip which has been attached to substrate 1 in well 30 formed in the substrate with chip attachment material 7 which is known in the art. The chip is in electrical contact with conductive material 22 located in the via 8 which forms a power connection to the chip. The chip is located adjacent to through hole 9 which is a molded internal cooling passage of a desired geometry, not necessarily circular and passes entirely through the substrate. Through holes 15 and 16 pass entirely through the substrate from top to bottom surfaces and have been filled with conductive material 23 to provide electrically conductive paths from one surface of the substrate to the other. Conductor 17 has been silk screened onto the substrate and connects the conductive material of hole 16 to that of hole 15. Pad area 6 has been molded into the top side of the substrate and has been filled with conductive material. The buss structure shown consists of grooves 10, 11, 12, 13, and 14. These grooves have been dimensioned and contoured to accept a bonding tool that welds wire 3 to the conductive material 24 at the bottom of groove 14 at the weldment shown at location 14a. The other end of wire 3 is shown welded to chip 2 at location 3a. Wire 4 is shown welded to chip 2 at location 4a and to pad 6 at location 5. It is seen that wire 3 crosses the conductive material in the bottom of grooves 10, 11, 12 and 13 and is supported and maintained away from the conductive paths by the material separating the grooves. Thus, the need for applying an insulating layer covering the conductive material 24 is obviated and connections in the grooves may be run across the buss structure without possibility of short circuit. The buss structure groove material at its highest point of elevation is located a small distance $\Delta H$ below the topmost plane of the structure. Grooves 18, 19, 20 and 21 have been filled with conductive material with a connection 25 shown running from hole 15 to conductor 18.

Referring now to FIG. 1, the top surface of the substrate with chips connected thereon is shown. The chips 2 are bonded to the substrate along the perimeter of a rectangle with connections 3 being made from chip pads to busses 10, 11, 12, 12 and/or 14. A lead 4 is also connected from a pad on chip 2 to the conductive material 23 in hole 16. A bus 25 is connected between conductive material 23 in hole 15 and bus 18. A channel 9 positioned in the substrate just below the chips 2 is shown in phantom. A channel 9 can be provided along the x and/or y axis and there can be several to remove heat from all chips on the substrate.

FIG. 3 shows the as molded green substrate that is shown in its fired and final assembled version in FIG. 1. Note the difference in the scale factors.

The mold or die required to form the final configuration must be scaled up from the dimensions of the final configuration by approximately 20 percent, i.e., the final desired dimensions must be multiplied by approximately 1.2 to determine the mold dimensions. The exact scaling factors involved are highly dependent upon the specific formulations and processing techniques utilized. The shrinkage in processing and sintering however is quite isotropic, so that all dimensions shrink very nearly to the same scale factor. The isotropic nature of the shrinkage insure that the angles maintained are very nearly identical in the green and fired article. The molding material employed here typically would be approximately 60% by volume of a fine grain aluminum oxide which has been milled to its ultimate crystal size and 10% by volume of a thermoplastic binder mixture. A typical formula for the thermoplastic binder mixture would be approximately one-third by weight of polyethylene, one-third by weight of paraffin wax, one-third by weight of beeswax with perhaps 0.1 through 0.2 percent of stearic acid added. The thermoplastic materials and aluminum oxide are mixed and blended together to a homogeneous mass at a temperature in excess of the melting point or flow point of the thermoplastic materials. Techniques for producing thermoplastic molding mixtures are well described in the prior art and will not be elaborated on here.

The cooled green molding material is crushed to pellet size or otherwise pelletized and is employed as a feed material for a subtantially conventional plastic injection molding machine that has been suitably modified to accept abrasive materials. The mold is constructed of steel or aluminum by techniques and principals well known in the art of plastic injection molding. The substrate is then injection molded.

The holes 9 are formed, for example, by having an insert in the mold in the form of an electrically conductive wire of proper cross section and located where the holes are to be formed. When the green body is formed, the molded part with wire is removed from the mold and the wire is heated sufficiently to melt the binder immediately there around and permit axial removal of the wire, thereby leaving the hole 9 in the green substrate in the region where the wire had been.

Subsequent manufacturing steps for specific devices and specific substrates may vary widely at this point. However, it is to be clearly understood that, irrespective of the variations in manufacturing steps and procedures that may take place at this point, at least a single molding operation has occurred and that the substrate may be reinserted into different cavities and subsequently may have an additional layer of the same or different materials compatable with the end objective of the substrate molded on or into or through the substrate. The number of combinations and permutations possible at this point is very great and anyone skilled in the art will be well aware of the number of possibilities that exists to them to manufacture the desired end item. Enumerating such possibilities would not materially contribute to the description of this invention and for the purposes of this description it will be assumed that no additional steps will be taken between the molding and firing of this particular device. However a list of possible operations that could be employed during this green phase, though by no means complete, would include the following possibilities:

(1) machining, (2) silk screen printing, (3) coating with resist and exposing, (4) filling grooves and vias, (5) laminating, (6) thermal welding.

Sintering of the substrate is accomplished in two distinct steps. First, the thermoplastic binder must be removed from the substrate. This is conveniently accomplished by slowly heating the substrate at a low pressure to evaporate or sublime thermoplastic material out of the substrate body as described by Strivens, however other methods are equally appropriate. Second, the substrate is then sintered with a sintering schedule and sintering atmosphere that is compatible for all the materials included in the substrate. If, for example, during substrate fabrication, a molybdenum metal face had been screened onto the green substrate at some portion of the manufacturing process, then the sintering atmosphere would best be reducing in nature. However, if the entire substrate is composed of an outside ceramic such as alumina, then the sintering is most conveniently perfomed in an air atmosphere. Beneficial use of sintering atmospheres is well known in the art.

The next step in the manufacture of the subject circuit is to apply the metallization to the desired locations in and on the substrate. The techniques employed to do this are well known in the art and the examples presented here are typical approaches that would be taken to achieve this objective. Grooves 18, 19, 20 and 21 are most conveniently metallized by spreading an electrically conductive metal glass frit composite slurry such as is used for silk screen printing across the groove area, thereby filling the grooves. The metallizing paste is dried and the substrate fired in accordance with the procedure required for the particular metallizing paste employed. As the groove structure under consideration here is located in the uppermost plane of the substrate, the metallizing paste that is bridging the gaps and spread about on the substrate surface in undesirable locations is most conveniently removed by mechanically abrading or lapping the uppermost surface. If the substrate is applied directly to the lap, only the uppermost plane comes into contact with the lap, thereby removing any material on that plane. In this manner the conductor grooves are filled with a metallized material which has assumed the geometry of the grooves. Through holes 15 and 16 are filled with the same pass of metallizing paste as was employed in the filling of grooves 18, 19, 20 and 21. At this time bonding pad 6 is also filled and bonding pad 6 is lapped back during the clean up operation that was employed to clean the regions surrounding the grooves 18, 19, 20 and 21. Conductor 17 is applied in this example most typically by silk screening the metallizing paste so that a conductive path between the hole ends of holes 16 and 15 are joined by metallizing material. The bottoms of grooves 10, 11, 12, 13, 14 and groove 8 are most conveniently filled with well known electrically conductive paste utilizing an inking pen of small bore capillary tubing. To insure the separation of conductive material between the grooves, it may be desirable to coat the upper sections of the grooves with a non-wetting wax resist which is most conveniently applied by a roller. While the conductive paste is in its green form, it may be conveniently tested for continuity and interconductor short circuits and repaired at this time prior to firing. In order to set the conductive material in its place, the substrate is fired at an elevated temperature with a time temperature atmosphere profile that has been established for optimum firing conditions for the paste being employed. It is obvious that a multiplicity of pastes and firing schedules may be employed for specific purposes, such as to apply resistant pads.

After firing and clean up operations, the chip 2 is attached to the substrate by any one of the chip attach techniques that are well known in the art. Element 7 is shown and represents chip attach material that is unspecified in this description. Conductor 8 has a low ohmic contact to chip 2 and represents in this description a power supply lead to chip 2.

The active microelectronics located in and on chip 2 are interconnected to the substrate through wires 3 and 4 at weldments 3a and 4a and weldments 5 and 14a. As is well known in the art, welding pad regions located at the surface of chip 2 are provided for this express purpose. The metallizing materials employed at locations 5 and 14a have been selected to be compatible with the weldment.

It is seen that wire 3, in going from groove 14 to the pad located at 3a, crosses conductors 13, 12, 11 and 10. The dimensions of wire 3 are normally on the order of 0.001 inches and the dimensions across the grooves 10, 11, 12, 13 and 14 would normally be on the order of 0.015 inches. The material conductor 3 is composed of would normally or typically be aluminum with 1% silicon added. Thus, very large unit forces would have to be applied to the wire 3 to cause it to contact the conductive material in one of the grooves across which the wire is suspended. The unit forces would be the same as if it were a one inch diameter aluminum bar bridging a 15 inch gap.

Cooling passage 9 is utilized to withdraw thermal energy from the chip 2 to a remote location to maintain the chip temperature within desired limits. This may be done by circulating a fluid through cooling channel 9 of a lower temperature than chip 2 to create a temperature difference between chip 2 and the fluid in cooling channel 9, thereby causing a heat flow from chip 2 to the fluid in channel 9 in accordance with well known thermodynamic and heat transfer principles. Use may be made of local boiling such as is found in a heat pipe to achieve very high thermal flux densities in the region surrounding the chip. These techniques are well known in the art of heat transfer and thermal energy management and are obvious to anyone skilled in this art once the availability of cooling passage 9 is presented to them.

While only a single hole 9 is shown passing under a single row of chips in FIG. 1, it should be understood that the hole 9 or holes 9 can take other configurations. For example, rather than passing from one end of the substrate to the adjacent end as shown in FIG. 1, there can also be holes in a transverse direction to pass under chips 2 positioned from left to right as shown in FIG. 1. Also, a single hole could be formed which is in the shape of a rectangle and passes under all chips 2 shown in FIG. 1 with closely adjacent entrance and exit for heat sink material disposed at a substrate edge. The latter embodiment would require molding of the substrate in two parts with half of the hole in each part. The parts would then be held together while in the green state in the shape of the final configuration with subsequent binder removal and sintering.

In the preferred embodiment described above, the substrate material was sintered aluminum oxide. Other preferred embodiments include the use of a metallic particulate material which has been mixed with a suitable plasticizing binder and molded into the desired complex geometry. The sintered metallic substrate could then be subsequently machined as in the case of the aluminum oxide substrate, but with the additional machine techniques that require a ductile or conductive material. For example, precise configuration could be coined into the surface as an extension of a crush forming operation or complex configurations could be electrically discharge machined into the surface. In this embodiment, the substrate would then be coated with a thin layer of insulating material, such as glass. Another embodiment exists in the use of molding a highly loaded plastic system, such as a glass filled epoxy, and directly utilizing the as molded article for the interconnection structure without subsequent binder removal and sintering.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

I claim:
1. A ceramic substrate comprising:
 (a) a body of electrically insulating materials having an upper surface and at least one other surface,
 (b) a plurality of grooves formed in the upper surface of said body,
 (c) continuous electrically conductive material disposed in the bottoms of said grooves and extending upward to a region below the tops of said grooves,
 (d) regions on said upper surface for disposing and securing to said upper surface heat emitting devices, and
 (e) a continuous aperture heat sink enclosed by and within said body in a plane substantially parallel to said upper surface and extending to at least one surface of said body and disposed closely adjacent said regions.
2. A ceramic substrate as set forth in claim 1 further including an aperture therein passing from said upper surface to said one other surface thereof, electrically conductive material disposed on said lower surface and electrically conductive material in said aperture.
3. A ceramic substrate as set forth in claim 1 wherein said heat emitting devices are semiconductors.
4. A ceramic substrate as set forth in claim 2 wherein said heat emitting devices are semiconductors.

* * * * *